United States Patent
Shirota

(10) Patent No.: US 10,916,558 B2
(45) Date of Patent: Feb. 9, 2021

(54) NOR FLASH MEMORY AND METHOD OF FABRICATING THE SAME

(71) Applicant: Winbond Electronics Corp., Taichung (TW)

(72) Inventor: Riichiro Shirota, Taichung (TW)

(73) Assignee: WINBOND ELECTRONICS CORP., Taichung (TW)

(*) Notice: Subject to any disclaimer, the term of this patent is extended or adjusted under 35 U.S.C. 154(b) by 0 days.

(21) Appl. No.: 16/235,329

(22) Filed: Dec. 28, 2018

(65) Prior Publication Data

US 2019/0312053 A1 Oct. 10, 2019

(30) Foreign Application Priority Data

Apr. 9, 2018 (JP) ................. 2018-074365

(51) Int. Cl.
*H01L 27/11582* (2017.01)
*H01L 27/11565* (2017.01)
*H01L 27/1157* (2017.01)
*G11C 16/16* (2006.01)
*G11C 16/26* (2006.01)
*H01L 21/28* (2006.01)
*H01L 27/11556* (2017.01)
(Continued)

(52) U.S. Cl.
CPC ........ *H01L 27/11582* (2013.01); *G11C 16/16* (2013.01); *G11C 16/26* (2013.01); *H01L 27/1157* (2013.01); *H01L 27/11565* (2013.01); *H01L 29/40117* (2019.08); *H01L 27/11519* (2013.01); *H01L 27/11524* (2013.01); *H01L 27/11556* (2013.01)

(58) Field of Classification Search
CPC ..... G11C 16/0483; G11C 16/10; G11C 16/16; H01L 27/11521; H01L 27/115; H01L 27/11524; H01L 27/11582
USPC ........ 257/E21.69, 314; 365/185.17; 438/257
See application file for complete search history.

(56) References Cited

U.S. PATENT DOCUMENTS 9,548,124 B1 * 1/2017 Hazeghi ................. G11C 16/20
2012/0051136 A1 * 3/2012 Kang ..................... G11C 16/16
365/185.17

(Continued)

FOREIGN PATENT DOCUMENTS

JP 2877462 3/1999
JP H11110987 A 4/1999

(Continued)

OTHER PUBLICATIONS

Korean Office Action based on corresponding Application No. 10-2018-0161359; dated Nov. 29, 2019.

*Primary Examiner* — Jonathan Han
(74) *Attorney, Agent, or Firm* — Muncy, Geissler, Olds & Lowe, PC

(57) ABSTRACT

NOR flash memory that includes three-dimensional memory cells is provided. In the NOR flash memory of the present disclosure, one memory cell includes one memory transistor and one selection transistor. A common source 5 is formed over a silicon substrate 9, and an active region 3 extending in a vertical direction to electrically connect to the common source 5 is formed. A control gate 4 of the memory transistor and a selection gate line 2 of the selection transistor are formed to surround a side portion of the active region 3, and a top portion of the active region 3 is electrically connected to a bit line 1.

13 Claims, 18 Drawing Sheets

(51) Int. Cl.
*H01L 27/11519* (2017.01)
*H01L 27/11524* (2017.01)

(56) References Cited

U.S. PATENT DOCUMENTS

| | | |
|---|---|---|
| 2012/0051143 A1 | 3/2012 | Yoon et al. |
| 2012/0257455 A1 | 10/2012 | Oh et al. |
| 2016/0079267 A1* | 3/2016 | Fukuzumi ......... H01L 27/11582 257/314 |
| 2017/0025177 A1* | 1/2017 | Kim ................... G11C 13/0033 |
| 2017/0194058 A1 | 7/2017 | Yoon et al. |

FOREIGN PATENT DOCUMENTS

| | | |
|---|---|---|
| JP | 2003100092 A | 4/2003 |
| JP | 2009283740 A | 12/2009 |

\* cited by examiner

|  | read-out | programming | erasing method 1 | erasing method 2 |
|---|---|---|---|---|
| BL1 | read1 | prog1 | FG | FG |
| BL2 | 0V | prog2 | FG | FG |
| SG1 | read2 | prog5 | FG | FG |
| SG2 | 0V | 0V | FG | FG |
| CG | read3 | prog3 | era1 | era3 |
| SL | 0V | prog4 | era2 | era4 |

NOR FLASH MEMORY AND METHOD OF FABRICATING THE SAME

PRIORITY CLAIM AND CROSS-REFERENCE

This application claims priority of Japan Patent Application No. 2018-074365, filed on Apr. 9, 2018, the entirety of which is incorporated by reference herein.

BACKGROUND OF THE INVENTION

Field of the Invention

The present disclosure relates to NOR-type flash memories, and more particularly to NOR-type flash memories including three-dimensional memory cells.

Description of the Related Art

The integrity of a NOR flash memory can be enhanced by use of a virtual ground system, a multiple-value system, and other methods. In a typical virtual ground system, the source/drain of a memory cell is common with a source/drain of its neighboring memory cell in a column direction, and the common source/drain is electrically connected to a bit line. A source of a selected memory cell is applied by a ground potential, the drain thereof is applied by a read-out voltage, and the source/drain of the neighboring memory cells are determined to be in a floating condition when performing a read-out action (Patent documents 1 and 2).

In the multiple-value system, a memory cell is set with a plurality of threshold values to control the electrical charges arriving at a floating gate or a charge storage region trapping electrical charges. Patent document 3 discloses a flash memory of a mirror-bit type acting as a multiple-value memory of a charge trapping type. The flash memory is formed with an ONO structure of an oxide film-nitride film-oxide film structure between the surface of a silicon substrate and a gate electrode, and traps electrical charges in the interfaces between the oxide films and the nitride film. Instead of applying a voltage to the source/drain, electrical charges are kept in the respective source side and drain side of the nitride film (the charge storage layer), and two bits of information are stored in one memory cell. Furthermore, a technology forming separated ONO films near two ends of a gate electrode to physically divide charge storage regions is also proposed.

PRIOR ART DOCUMENTS

Patent Documents

[Patent document 1] Japanese Patent Publication Number: JP2003100092
[Patent document 2] Japanese Patent Publication Number: JPH11110987
[Patent document 3] Japanese Patent Publication Number: JP2009283740

BRIEF SUMMARY OF THE INVENTION

Problems to be Solved

In a NOR flash memory, the scaling-down of memory cells creates a bottleneck because of the problems that occur when decreasing the gate length, the gate width, etc. These problems include punch-through, the short channel effect, and others.

Solutions

In accordance with some embodiments of the present disclosure, a NOR-type flash memory comprises a substrate; a conductive region formed over the substrate; a plurality of column portions extending from the surface of the substrate in a vertical direction, and comprising active regions; and memory transistors and select transistors formed to surround the side portions of each of the column portions, wherein control gates are connected to the gates of the memory transistors, and select gates are connected to the gates of the select transistors; one end of each of the respective column portions is electrically connected to a bit line, and the other end of each of the respective column portions is electrically connected to the conductive region; and one memory cell comprises one memory transistor and one select transistor.

In accordance with some embodiments of the present disclosure, a method of fabricating a NOR-type flash memory comprises forming a conductive region over a substrate; forming a first conductive layer over the conductive region with a first insulating layer interposed therebetween; forming a second conductive layer over the first conductive layer with a second insulating layer interposed therebetween; forming a third insulating layer over the second conductive layer; forming a plurality of openings from the third insulating layer toward the conductive region; forming insulating layers for charge storage and active regions of column structures in each of the openings; and etching the second conductive layer to separate the second conductive layer at positions between the neighboring column structures, wherein one end of each of the respective active regions is electrically connected to the conductive region through a contact hole in the respective opening, and the other end of each of the respective active regions is electrically connected to a bit line; the first conductive layer or the second conductive layer is the gate of a memory transistor, and the other is the gate of a select transistor; and one memory cell comprises one memory transistor and one select transistor.

Technical Effects

It is an object of the present disclosure to provide a NOR flash memory comprising three-dimensional memory cells in order to solve such conventional problems. In accordance with the present disclosure, it is possible to form active regions of memory cells resulting from setting the memory cells to be three-dimensional, without suffering from the limitations caused by two-dimensional scaling-down. According to the above description, it is possible to increase the integrity of memory cells under a high operating current.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
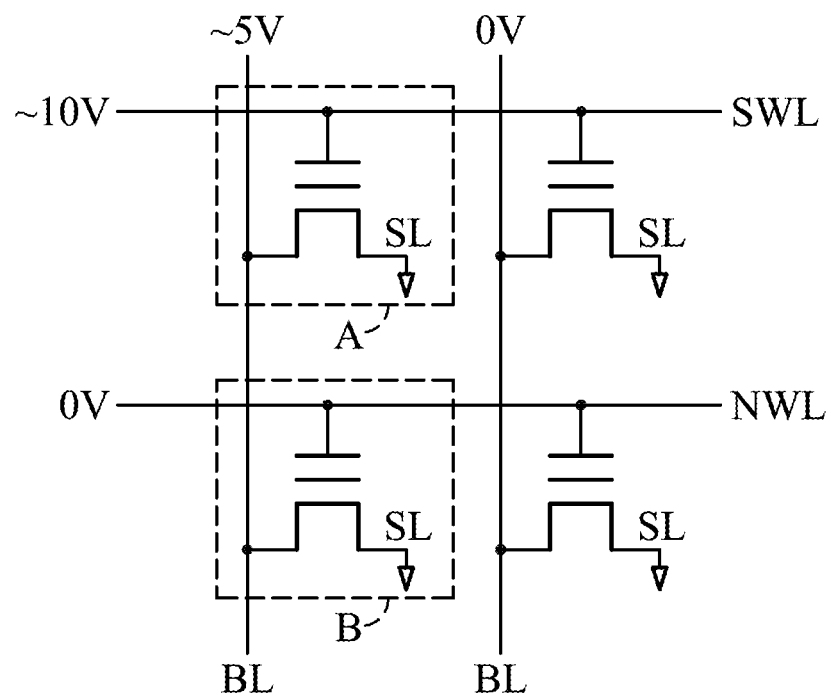
FIG. 1 is a diagram illustrating an equivalent circuit of memory cells of a NOR flash memory.
Figure 2:
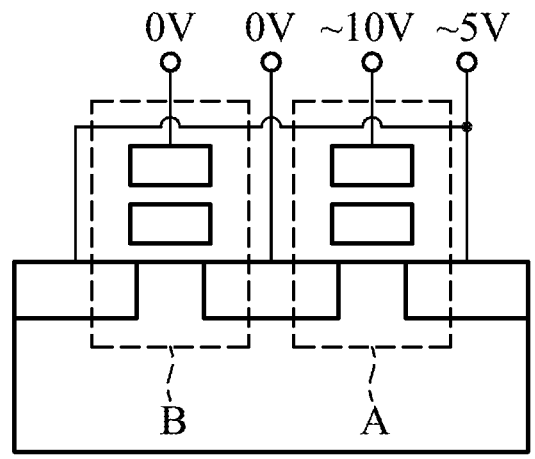
FIG. 2 is a cross-sectional view of the memory cells shown in FIG. 1.

FIG. 1 is an equivalent circuit diagram of a memory cell array of a NOR flash memory, and FIG. 2 is a schematic cross-sectional view of the memory cell. A cell A is a programmed memory cell, wherein in the memory cell A, during the programming action, approximately 10V is applied to a select word line SWL, a voltage of between 4V and 5V is applied to a bit line BL, a source line SL is provided with GND, and a floating gate of the memory cell A is injected with electrons. A cell B is disposed adjacent to the memory cell A, and is a non-selected memory cell. A non-select word line NWL of the memory cell B is floating (approximately the same as "grounded"), while between 4V and 5V is applied to the bit line BL, and a source line SL is provided with GND or voltage close to GND (the voltage provided to the source line SL is ~0V in FIG. 2).

It is necessary that the gate length of the memory cell B is greater than or equal to 100 nm for suppressing the current leakage from the bit line BL to the source line SL, and it is impossible to decrease the gate length any further. Also, the gate width of the memory cell B cannot be decreased further in order to obtain high read-out current when performing read-out. According to the reasons described above, it is becoming difficult to increase the degree of integrity of NOR flash memories and decrease the per-bit cost.

Next, embodiments of the present disclosure are described in detail with reference to the drawings. In this embodiment, a three-dimensional NOR flash memory is exemplified. Furthermore, drawings are shown for ease of description of the present disclosure, and it should be noted that the scale of the each of the components shown in the drawings does not necessarily coincide with the scale of the real device.

EXAMPLES

Figure 8:
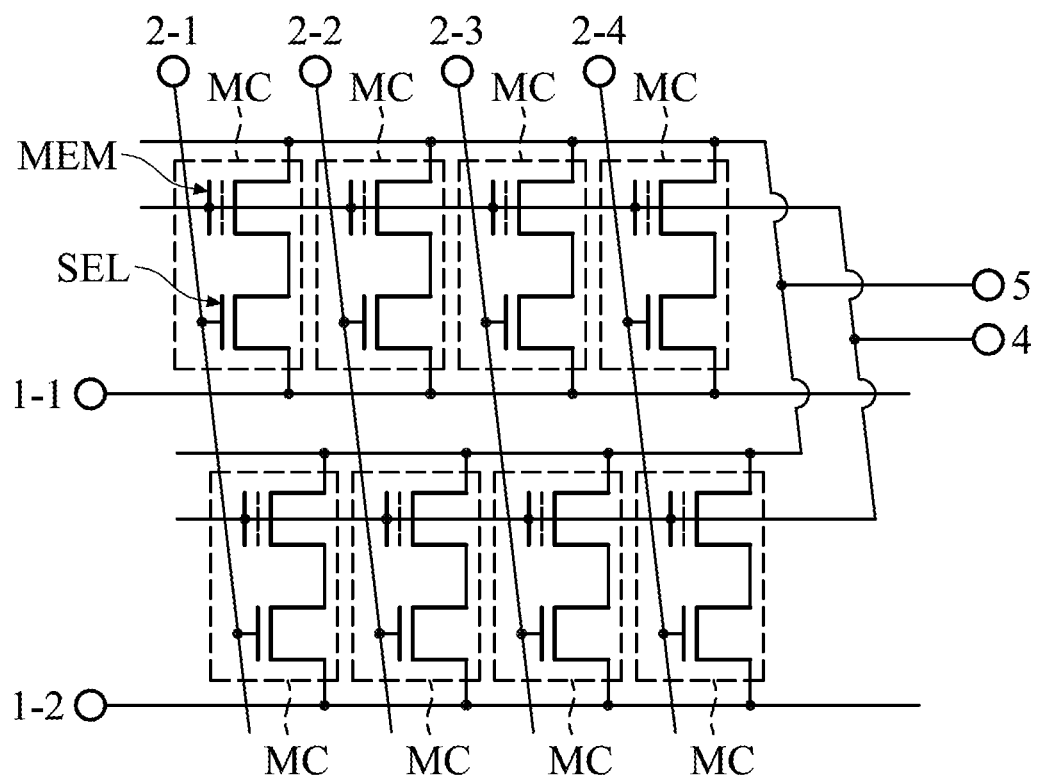
FIG. 8 is an equivalent circuit diagram of memory cells in accordance with the present disclosure.

The NOR flash memory, in accordance with an example of the present disclosure, is different from conventional memory cells in that one memory cell is constructed by one select transistor and one memory transistor. Furthermore, the select transistor and the memory transistor have channels that extend in an approximately vertical direction to the substrate. In FIG. 8, an equivalent circuit diagram of the memory cell array is shown, in accordance with this example. Here, a memory cell array with four columns and two rows is exemplified. One memory cell MC is constructed by one select transistor SEL and one memory transistor MEM. The select transistors SEL and the memory transistors MEM of each of the memory cells are connected in series between a bit line 1-1 and a common source 5, and the select transistors SEL and the memory transistors MEM of each of the memory cells are connected in series between a bit line 1-2 and the common source 5. Select gate lines 2-1, 2-2, 2-3 and 2-4 are commonly electrically connected to the gates of the select transistors SEL in the row direction, and a common control gate 4 is commonly electrically connected to the control gates of the memory transistors MEM of each of the memory cells MC. The select transistors SEL have the function of selecting memory transistors MEM. Further to the subsequent descriptions, when giving generic names to the bit lines and the select gate lines, they are respectively referred to as bit lines 1 and select gate lines 2.

Figure 3:
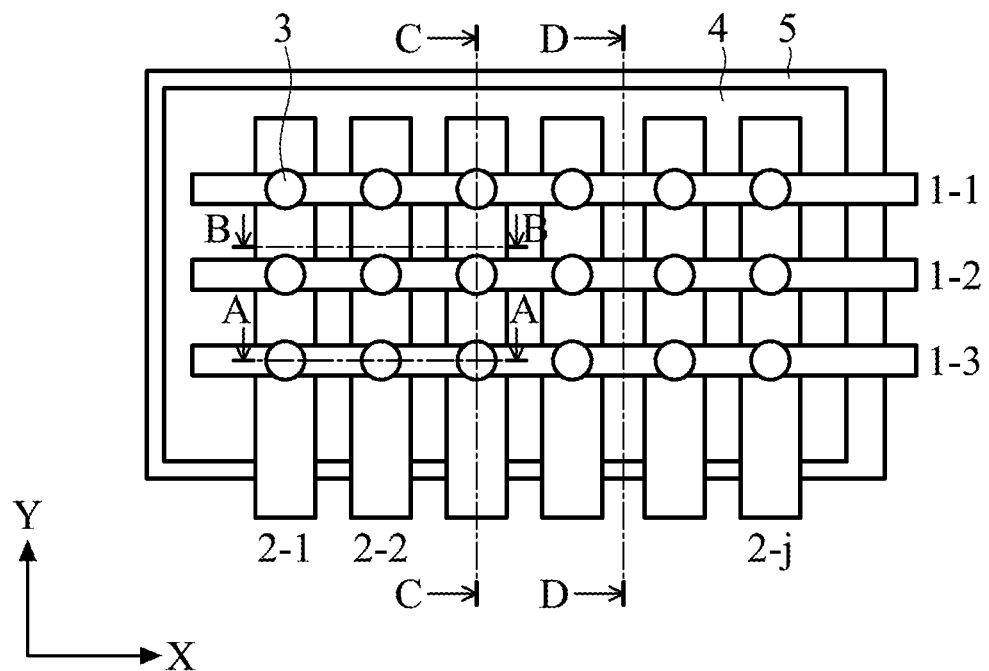
FIG. 3 is a schematic top view of a memory cell structure of a flash memory in accordance with the present disclosure.

First, the details of the memory cell array structure of the NOR flash memory are described in accordance with this example. As shown in FIG. 3, bit lines 1-1, 1-2 and 1-3 extend in the X direction, and select gate lines 2-1-2-4 under the bit lines 1 extend in the Y direction. In crossing regions of the respective bit lines 1 and the respective select gate lines 2, active regions 3 extending in a vertical direction are formed. The active regions 3 provide channel regions for the select transistors SEL and the memory transistors MEM.

Figure 4A:
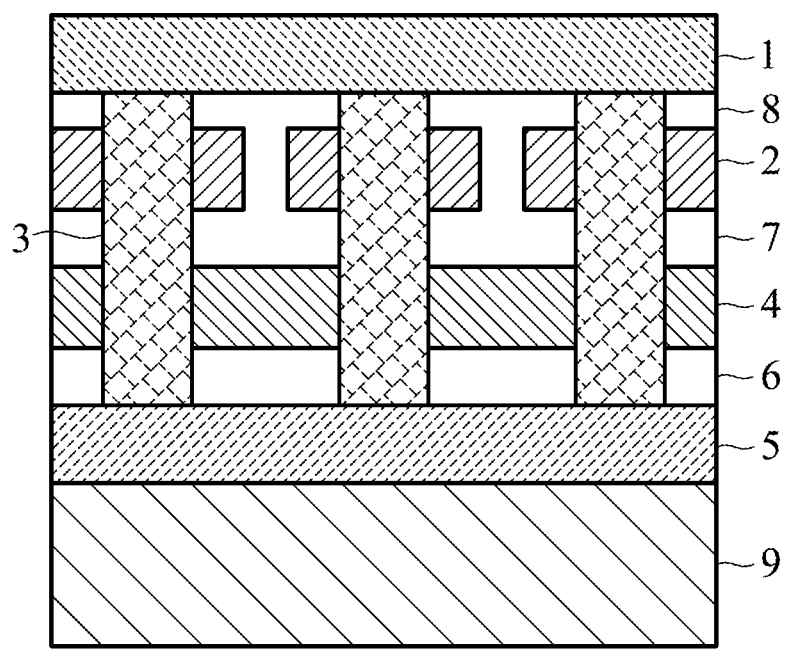
FIG. 4A is a cross-sectional view along line A-A of the memory cell structure shown in FIG. 3.

As shown in FIG. 4A, a common source 5 is formed over a silicon substrate 9. The common source 5 is formed in the entire region where the memory cell array is formed, and is shared by all the memory cells of the memory cell array. The common source 5 may be an impurity diffusion region implanted by impurities in the silicon substrate 9, or also may be a conductive layer (for example, a conductive polycrystalline silicon layer doped by impurities) formed on the surface of the silicon substrate 9.

Figure 4B:
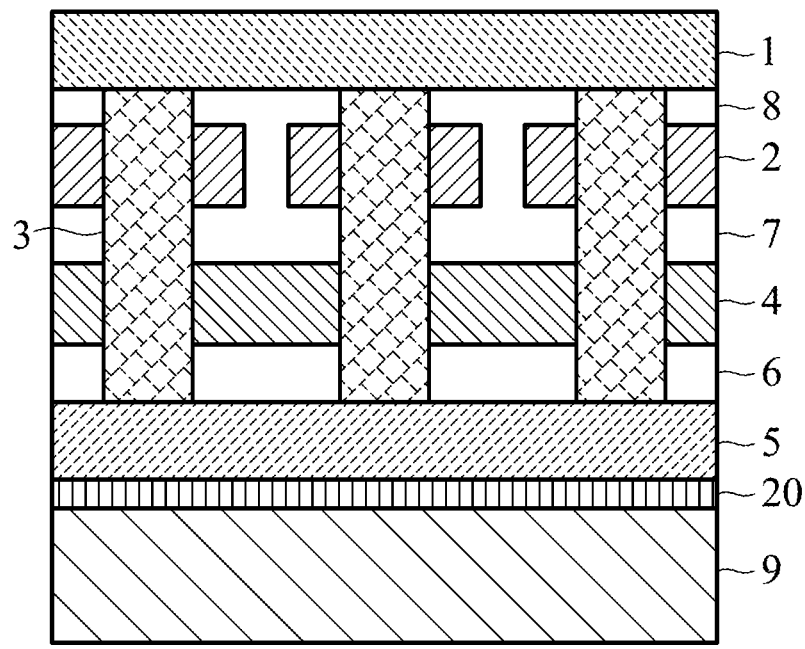
FIG. 4B is a cross-sectional view illustrating an alternative embodiment of the cross-section along line A-A of the memory cell structure shown in FIG. 3.
Figure 5:
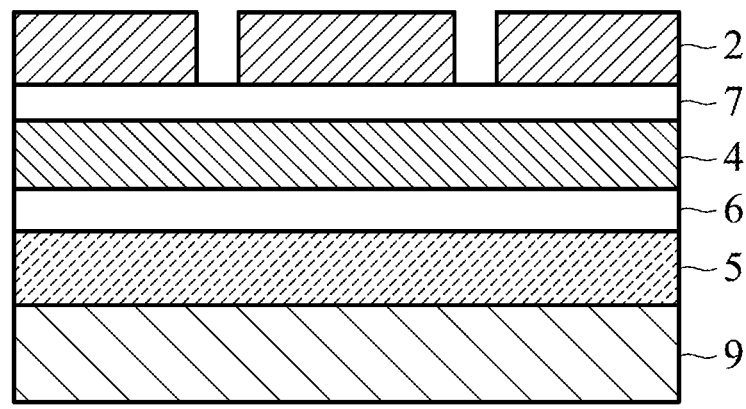
FIG. 5 is a cross-sectional view along line B-B of the memory cell structure shown in FIG. 3.

Referring to FIG. 4B, an insulating layer 20 is formed over the silicon substrate 9, and the common source 5 is formed over the insulating layer 20. In this example, a circuit of CMOS transistors, capacitors, resistors, diodes, etc., may be formed over the silicon substrate 9 and under the insulating layer 20. The present disclosure may be adapted to any of the examples illustrated in FIG. 4A and FIG. 4B. In the following descriptions, the example shown in FIG. 4A is used.

Figure 6:
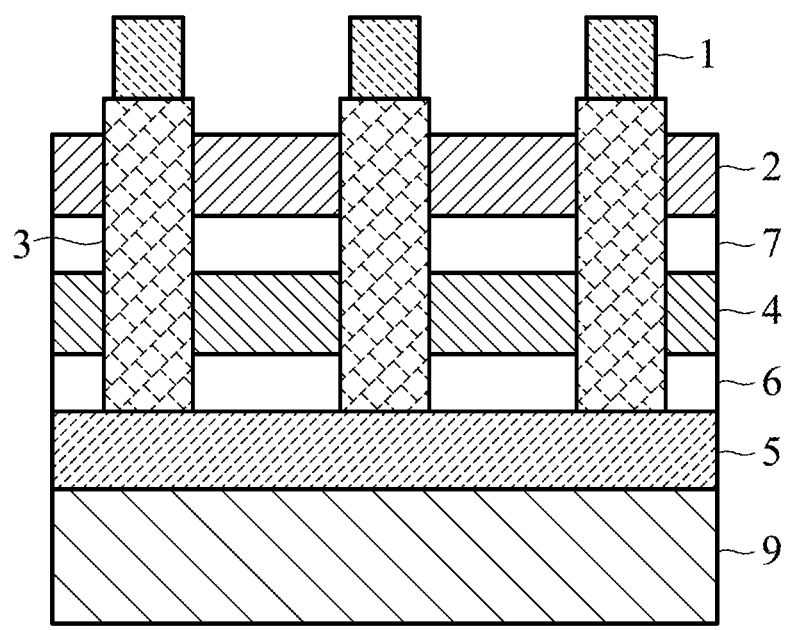
FIG. 6 is a cross-sectional view along line C-C of the memory cell structure shown in FIG. 3.
Figure 7:
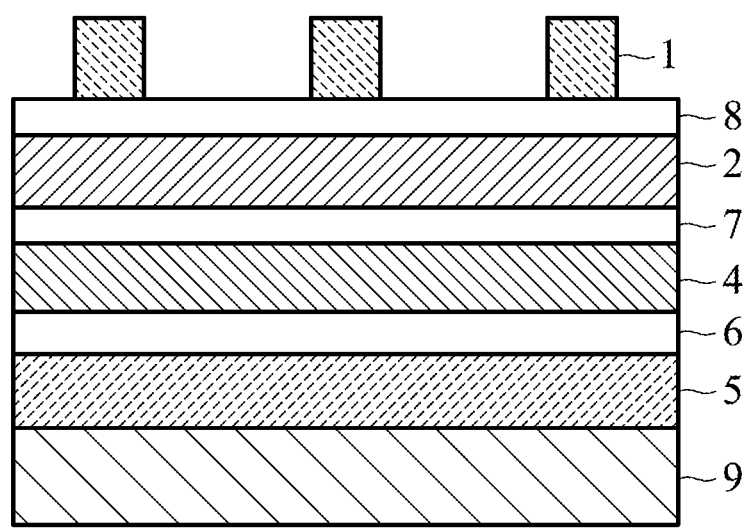
FIG. 7 is a cross-sectional view along line D-D of the memory cell structure shown in FIG. 3.

An insulating layer, the control gate 4, an insulating layer 7, the select gate lines 2, an insulating layer 8 and the bit lines 1 are laminated over the common source 5. The active regions 3 are formed in the crossing sections of the bit lines 1 and the select gate lines 2. The active regions 3 comprising channel regions are formed in the vertical region relative to the silicon substrate 9, as shown in FIG. 4A and FIG. 6. One end of each of the respective active regions 3 is electrically connected to the common source 5, and the other end is electrically connected to the bit lines 1. The insulating layer 6 is formed on the entire surface of the common source 5, and the control gate 4 is formed on the entire surface of the control gate 4. The control gate 4 is shared by all the memory cells of the memory cell array. That is, the control gate 4 is entirely formed as one surface.

The insulating layer 7 is formed on the entire surface of the control gate 4, and a plurality of select gate lines 2-1, 2-2, . . . , 2-j extending in the Y direction are formed over the insulating layer 7. The insulating layer 8 is formed over the select gate lines 2, and a plurality of bit lines 1-1 and 1-2 extending in the X direction are formed over the insulating layer 8.

Thus, the memory cell array shown in FIG. 8 is constructed. One memory cell MC is constructed by one select transistor SEL and one memory transistor MEM. The memory transistor MEM comprises a control gate 4, a floating gate (charge storage layer), and an active region 3, wherein electrons are stored in the floating gate. The select transistor SEL comprises a select gate line 2 and an active region 3, and is conducted when a somewhat positive voltage is applied to the select gate line 2, which may set the memory transistor MEM to electrically connect to the bit line 1. Furthermore, a decoder for selecting and driving the bit line 1, the select gate line 2, and the common source 5 is connected to the memory cell array, although FIG. 8 does not show that. Then, every node of the bit line 1, the select gate line 2, the common control gate 4, and the common source 5 is supplied with proper bias voltage through the decoder when performing the read-out action, the programming action, or the erasing action.

Next, referring to from FIG. 9A to FIG. 10I, a method of fabricating the memory cell array of the NOR flash memory in accordance with this example is described in detail.

Figure 9A:
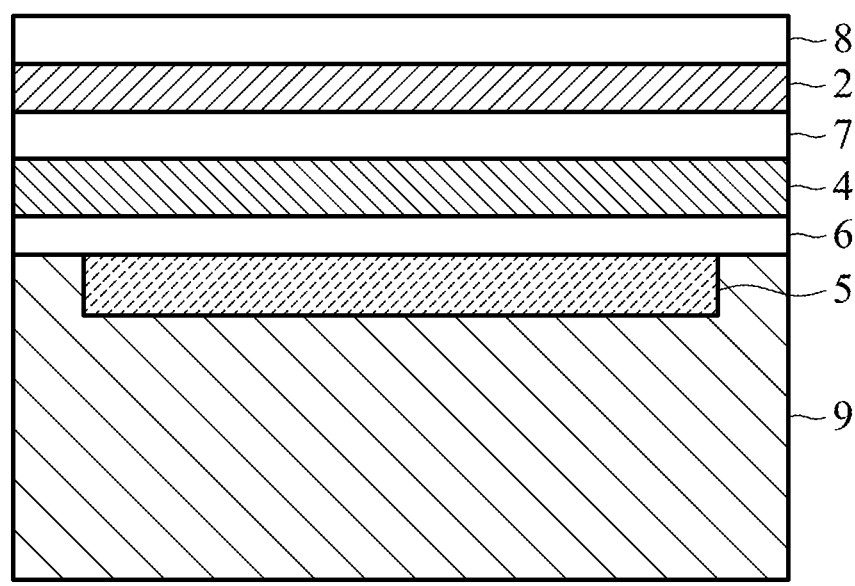
FIG. 9A is a cross-sectional view illustrating a fabrication step of the flash memory in accordance with the present disclosure.

As shown in FIG. 9A, the p-type silicon substrate 9 is implanted with elements, such as arsenic (As) or phosphorus (P), for forming an n-type silicon layer, and the common source 5 with $n^+$ a high impurity concentration is formed on the surface of the silicon substrate 9. The common source 5 is formed in the entire region where the memory cell array will be formed. The insulating film 6, such as a silicon oxide film, for example, is formed over the silicon substrate 9 comprising the common source 5, and the control gate 4 is formed over the insulating film 6. The control gate 4 is a conductive polycrystalline silicon layer, for example. The insulating film 7 is formed over the control gate 4, followed by forming the conductive polycrystalline silicon layer 2, for example, over the insulating film 7 for the select gate line. The insulating layer 8 is formed over the polycrystalline silicon layer 2.

Figure 9B:
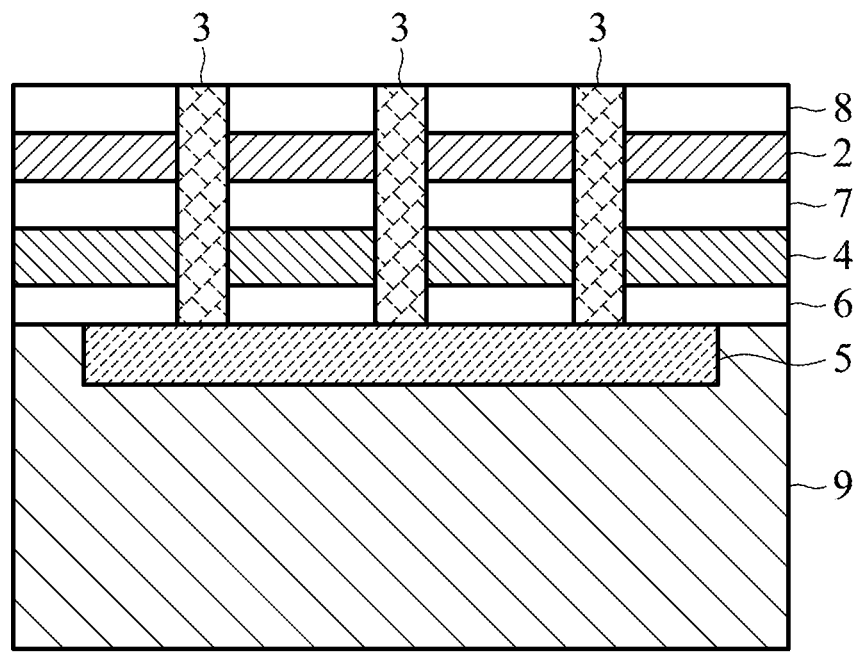
FIG. 9B is a cross-sectional view illustrating a fabrication step of the flash memory in accordance with the present disclosure.

Next, as shown in FIG. 9B, the active regions 3 extending in the vertical direction relative to the substrate 9 are formed. The detailed fabrication method of the active regions 3 will be subsequently described.

Figure 9C:
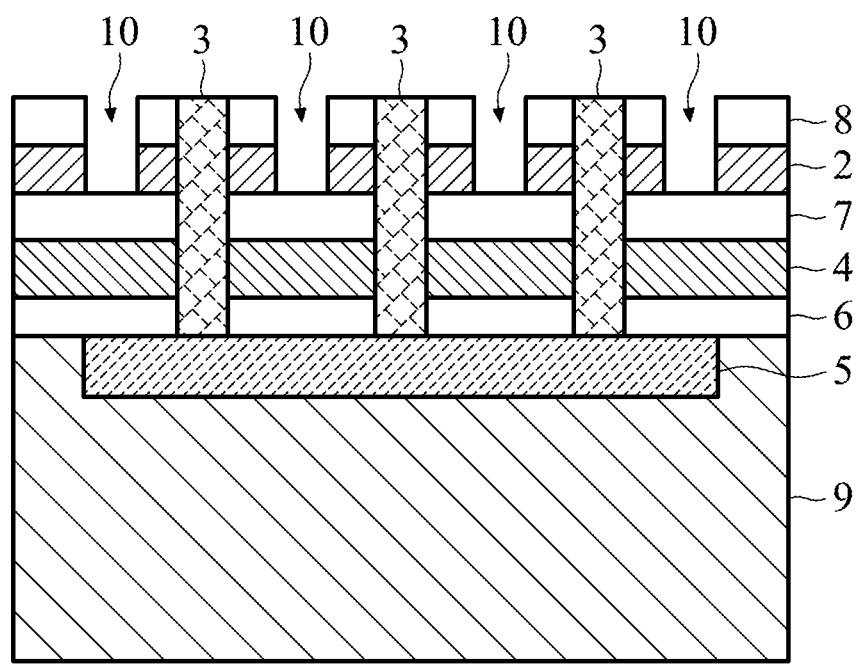
FIG. 9C is a cross-sectional view illustrating a fabrication step of the flash memory in accordance with the present disclosure.

Next, the insulating layer 8 and the polycrystalline silicon layer 2 are simultaneously etched by a photolithography step, and a plurality of select gate lines 2 spaced by etched regions 10 in the Y direction and extending in the Y direction are formed, as shown in FIG. 9C.

Figure 9D:
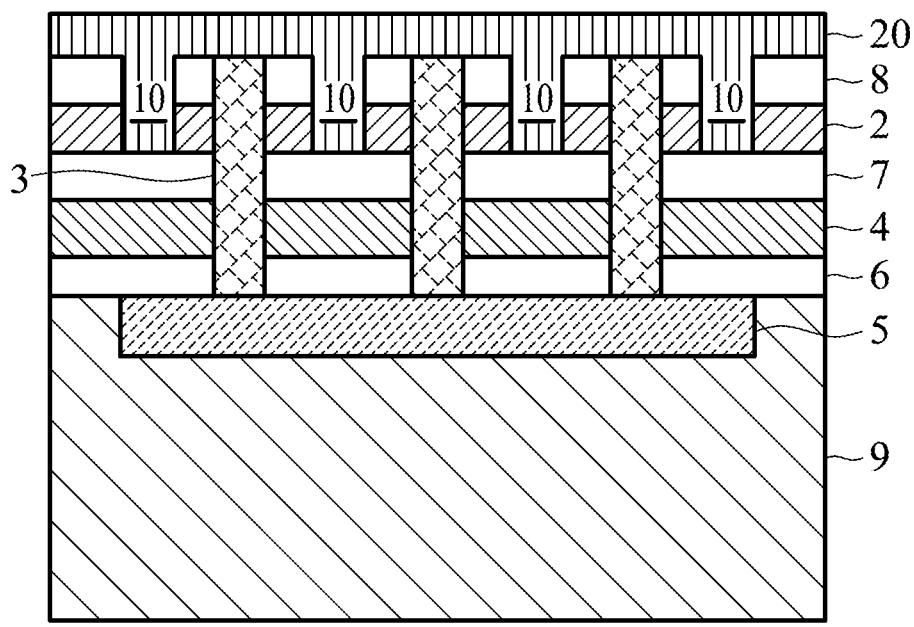
FIG. 9D is a cross-sectional view illustrating a fabrication step of the flash memory in accordance with the present disclosure.

Next, the insulating film 20 is deposited on the entire surface comprising the etched regions 10, allowing the insulating film 20 to remain only in the recesses of the etched regions 10, as shown in FIG. 9D. In some embodiments, a self-aligned silicide of the select gate line 2 may be formed through the etched regions 10 for forming a select gate line 2 with low resistance.

Figure 9E:
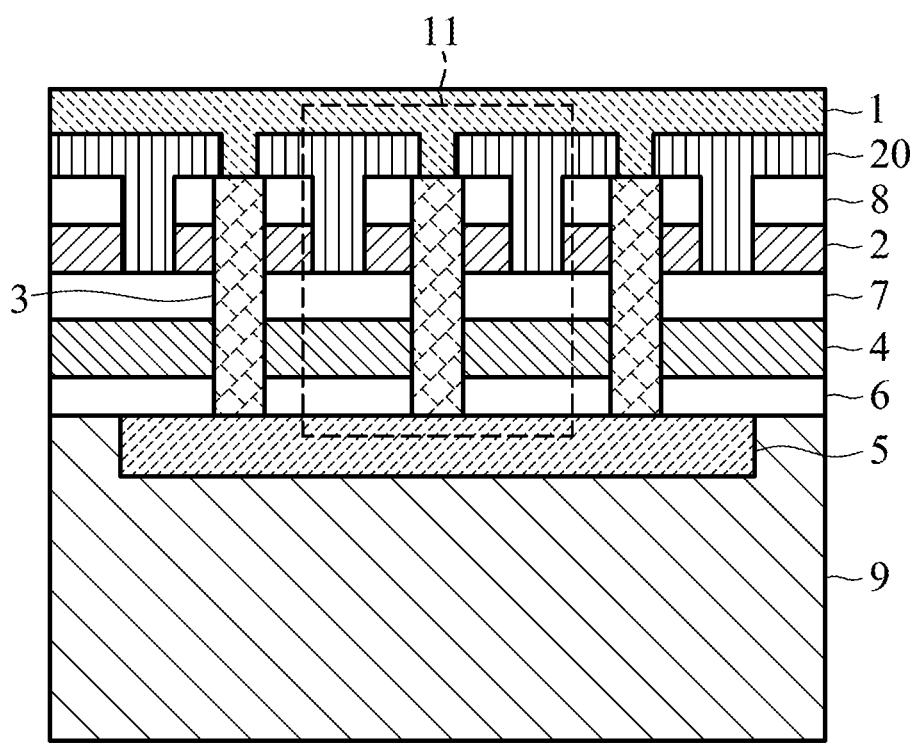
FIG. 9E is a cross-sectional view illustrating a fabrication step of the flash memory in accordance with the present disclosure.

Next, contact holes for exposing the ends of the active regions 3 are formed in the insulating film 20, followed by depositing a metallic material on the entire surface and patterning the metallic material. As shown in FIG. 9E, a bit line 1 connected to the ends of the active regions 3 or the polycrystalline silicon of column structure is formed.

Figure 10A:
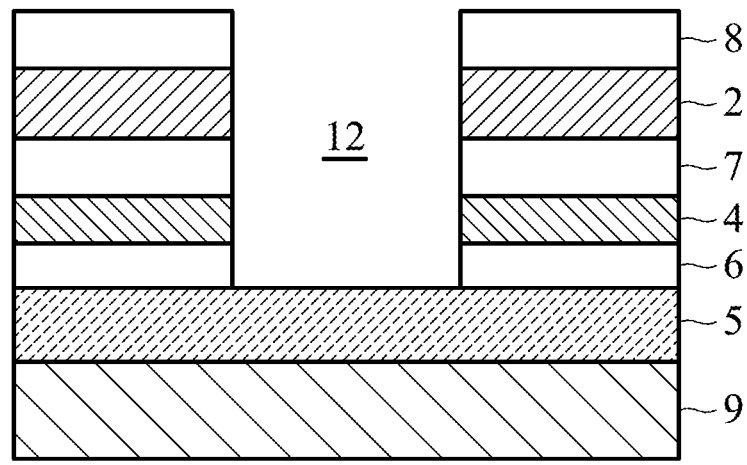
FIG. 10A is a cross-sectional view illustrating a fabrication step of the flash memory in accordance with the present disclosure.

Next, the steps of the process for forming the region 11 surrounded by the dashed line seen in FIG. 9E are described with reference to FIGS. 10A through 10I. After the formation of the insulating layer 8, an opening 10 is formed, achieving a common source 5 from the insulating layer 8, as shown in FIG. 10A. For example, a mask layer used for etching is formed over the insulating layer 8, and an opening with a round shape is formed in the mask layer used for etching in a photolithography step, followed by performing anisotropic etching through the mask layer used for etching, and forming the opening, achieving a common source 5 from the insulating layer 8.

Figure 10B:
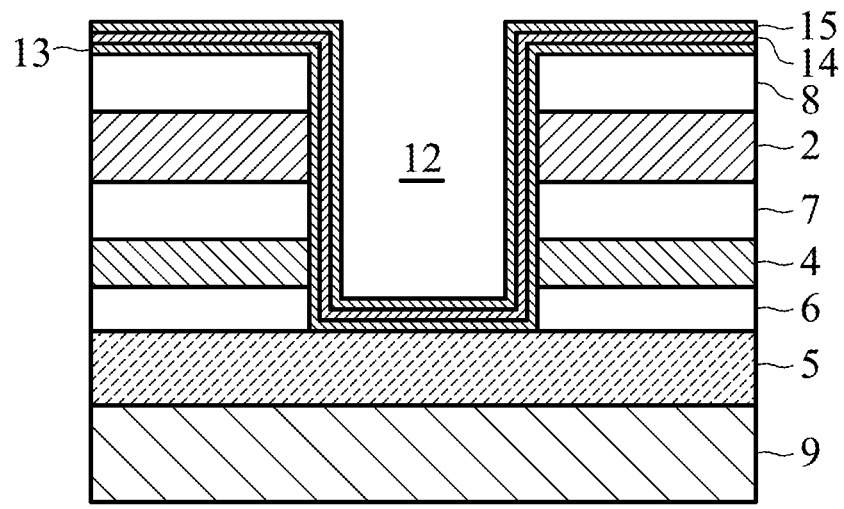
FIG. 10B is a cross-sectional view illustrating a fabrication step of the flash memory in accordance with the present disclosure.

Next, as shown in FIG. 10B, insulating layers 13, 14 and 15 are laminated over the insulating layer 8 comprising the opening 12. For example, an oxide film 14, a nitride film 15 and an oxide film 16 are laminated. The intermediate insulating film 14 functions as a layer to store electrical charges.

Figure 10C:
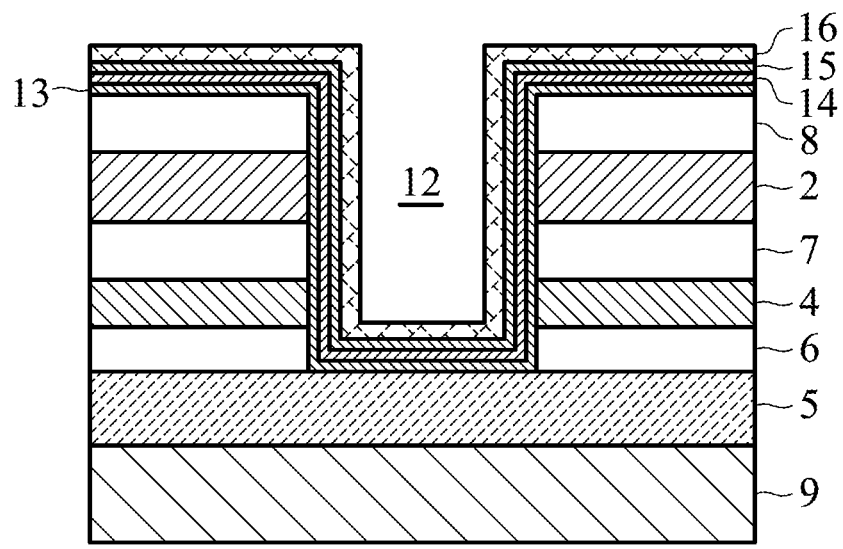
FIG. 10C is a cross-sectional view illustrating a fabrication step of the flash memory in accordance with the present disclosure.
Figure 10D:
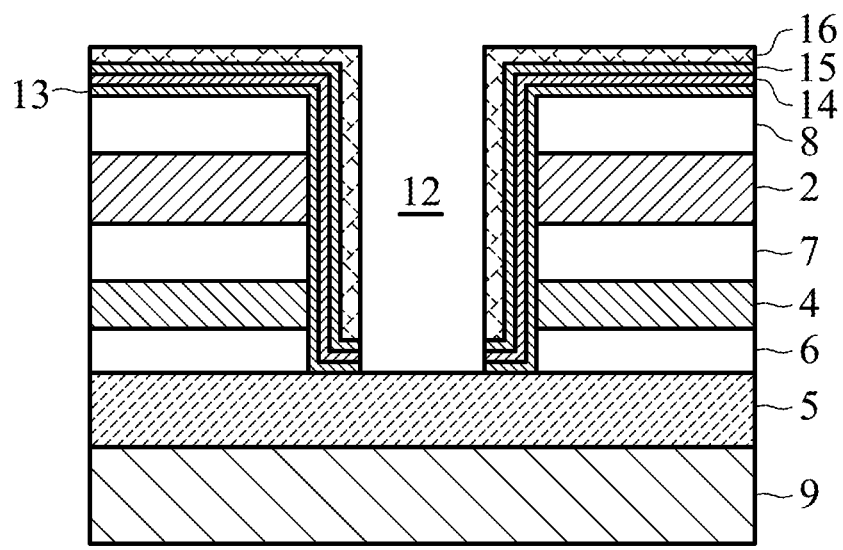
FIG. 10D is a cross-sectional view illustrating a fabrication step of the flash memory in accordance with the present disclosure.
Figure 10E:
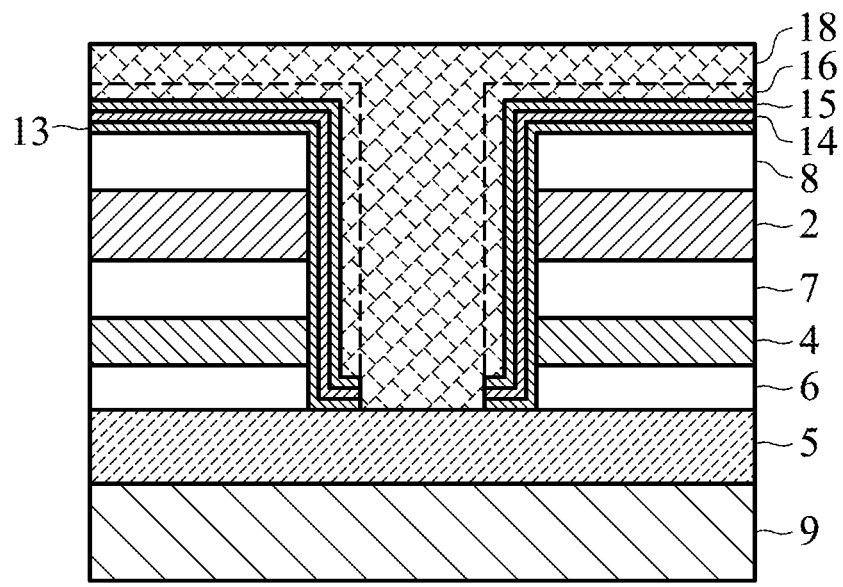
FIG. 10E is a cross-sectional view illustrating a fabrication step of the flash memory in accordance with the present disclosure.

Next, as shown in FIG. 10C, a polycrystalline silicon layer 16 is deposited over the insulating layer 15 comprising an opening 12 with a constant thickness using, for example, CVD. Next, as shown in FIG. 10D, the polycrystalline silicon layer 16 and the insulating layers 13, 14 and 15 at the bottom of the opening 12 are removed by etching, and the surface of the common source 5 is exposed. The polycrystalline silicon layer 16 protects the insulating films 13, 14 and 15 comprising the insulating layer 14 constructing a charge storage layer from etched.

Next, a second polycrystalline silicon layer 18 is deposited over the polycrystalline silicon layer 16 comprising an opening 12 using CVD, for example, to fill the opening 12 with the polycrystalline silicon layer 18. The polycrystalline silicon layer 18 is provided with a p-type layer and is doped with boron, for example, or the like. Alternatively, the polycrystalline silicon layer 18 is prepared to be a polycrystalline silicon layer free of impurities such as boron. The polycrystalline silicon layer 18 is electrically connected to the common source 5 exposed at the bottom of the opening 12.

Figure 10F:
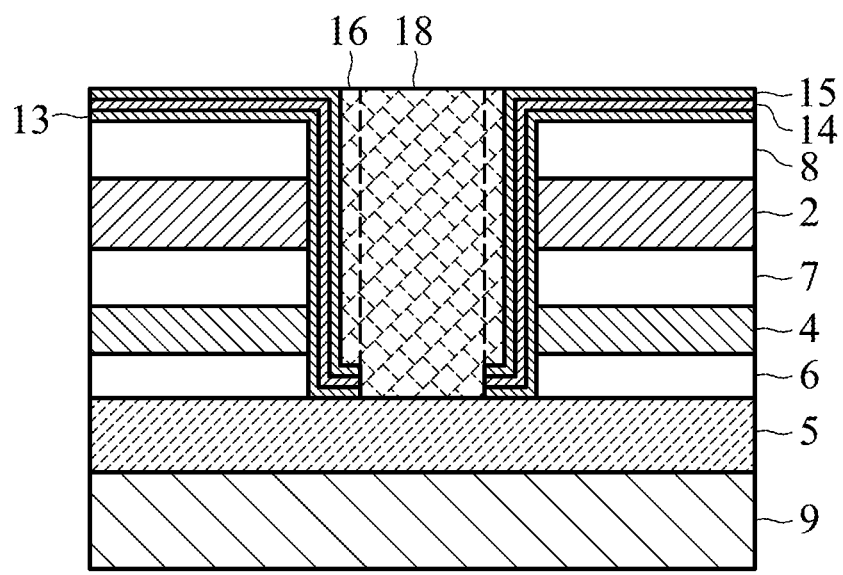
FIG. 10F is a cross-sectional view illustrating a fabrication step of the flash memory in accordance with the present disclosure.

Next, as shown in FIG. 10F, the polycrystalline silicon layers 16 and 18 are processed by a planarization treatment according to CMP or an etch-back treatment until the insulating layer 15 is exposed, resulting in only the polycrystalline silicon layers 16 and 18 remaining in the interior of the opening 12.

Figure 10G:
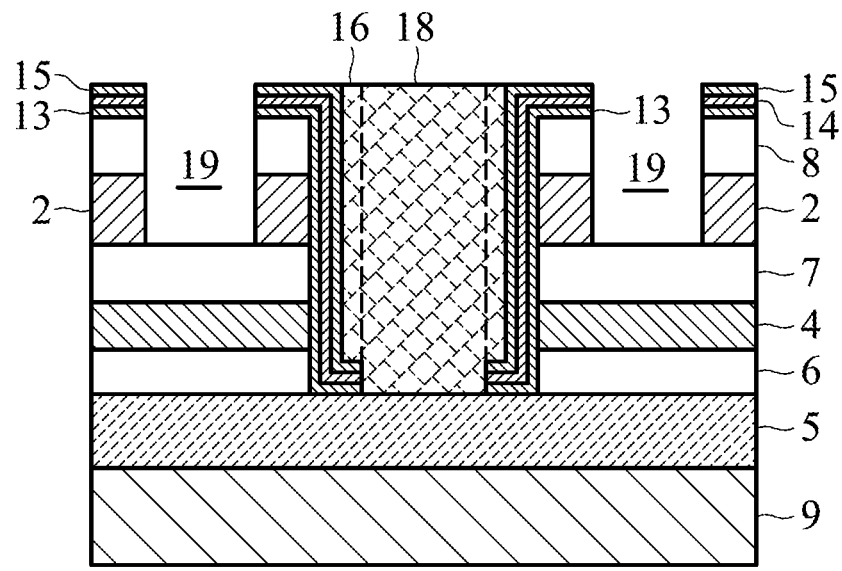
FIG. 10G is a cross-sectional view illustrating a fabrication step of the flash memory in accordance with the present disclosure.

Next, as shown in FIG. 10G, the laminated insulating layers 13, 14 and 15 and the select gate layer are etched, and the patterned select gate lines 2 are formed. The neighboring select gate lines 2 are spaced by spaces 12 formed by etching.

Figure 10H:
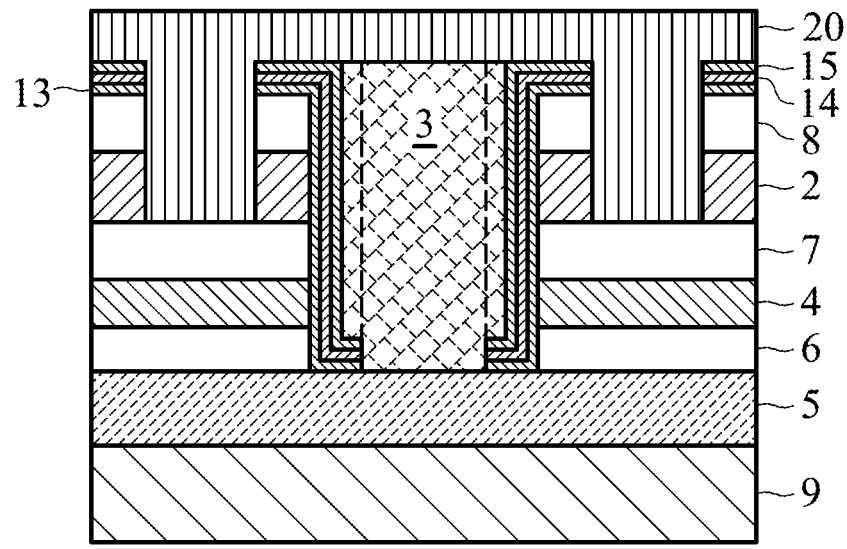
FIG. 10H is a cross-sectional view illustrating a fabrication step of the flash memory in accordance with the present disclosure.

Next, as shown in FIG. 10H, the insulating layer 20 is deposited on the entire surface. The common source 5 is doped with n-type impurities with a high concentration of phosphorous, arsenic, and the like. The n-type impurities diffuse (for example, via thermal diffusion) into the bottoms of the channel regions, and n-type silicon regions are formed there. Alternatively, on the surface sides of the channel regions, an ion implantation with n-type impurities is performed, and n-type silicon regions are formed there.

Figure 10I:
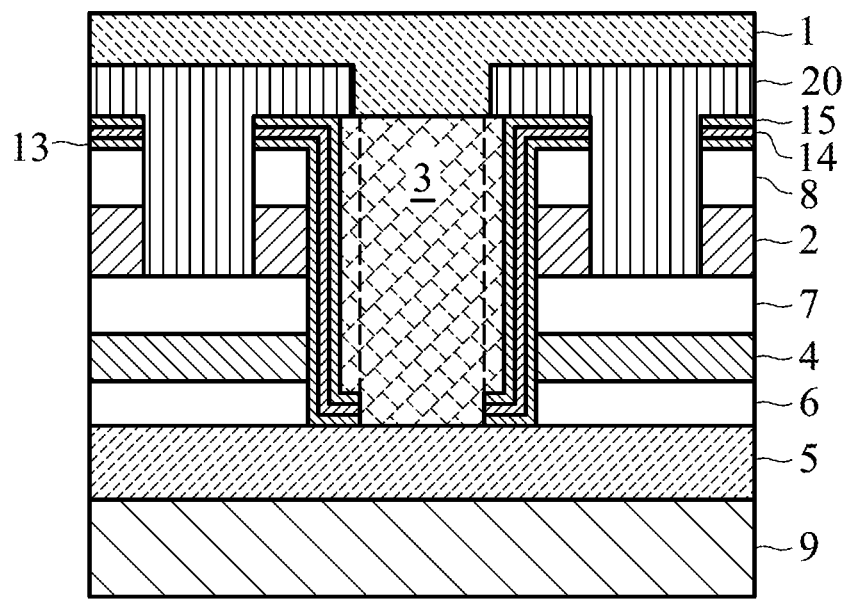
FIG. 10I is a cross-sectional view illustrating a fabrication step of the flash memory in accordance with the present disclosure.

Next, as shown in FIG. 10I, the insulating layer 20 over the active regions 3 is etched, and then a bit line 1 is formed. The bit line 1 is electrically connected to the active regions 3, namely the channel regions 16 and 18 through the opening of the insulating layer.

Figure 11:
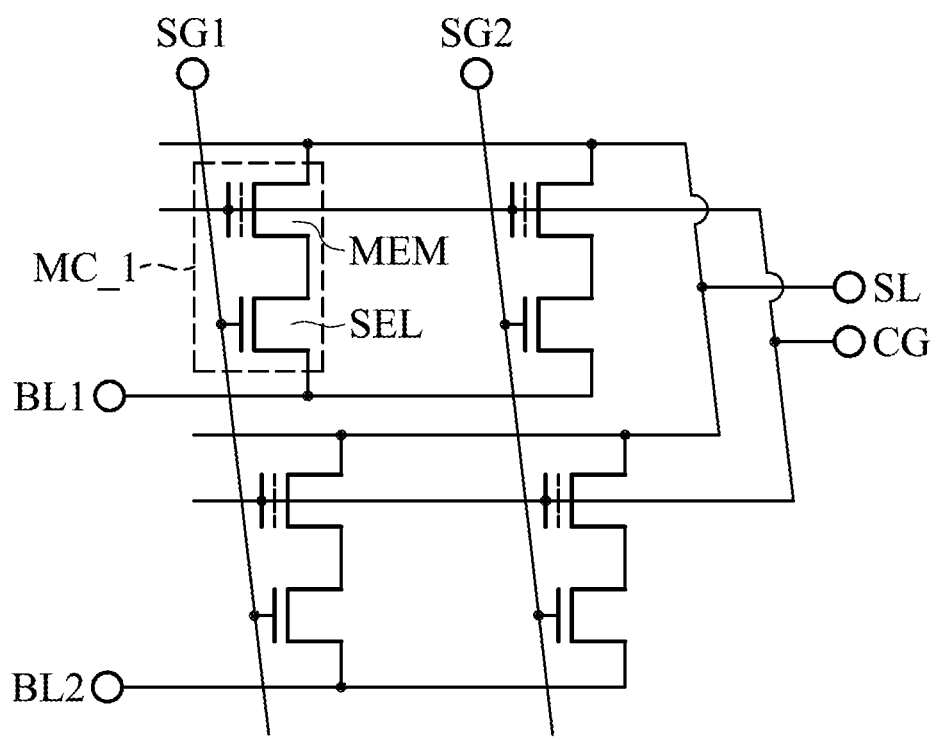
FIG. 11 is an equivalent circuit diagram of four memory cells of the flash memory in accordance with the present disclosure.
Figures 12, 13:
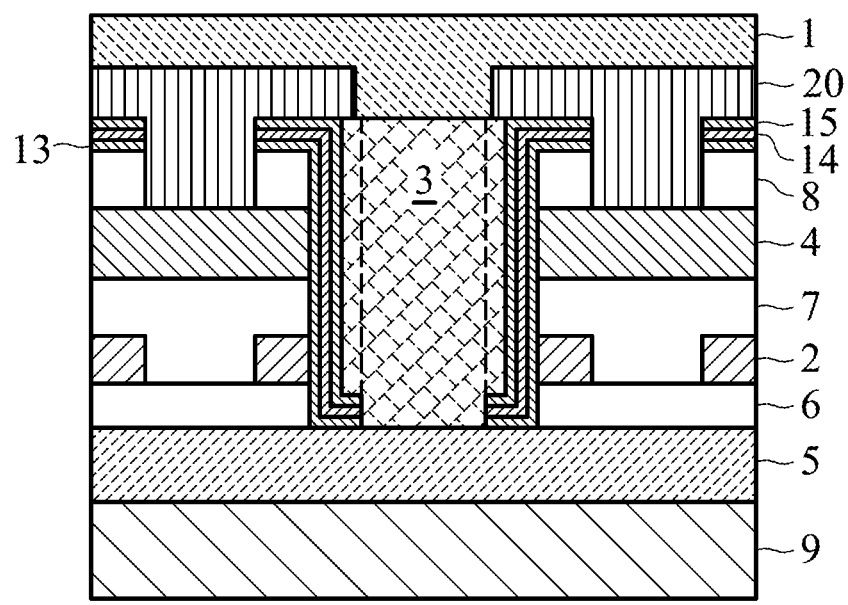
FIG. 12 is a table illustrating bias conditions during the read-out action, the programming action and the erasing action of the flash memory in accordance with the present disclosure.
FIG. 13 is a cross-sectional view illustrating a configuration of memory cells of the flash memory in accordance with an exemplary variation of the present disclosure.

Next, the actions of the NOR flash memory in accordance with this example are described. In the memory cell array shown in FIG. 11, the memory cell MC_1 is set to be selected, and the other memory cells are set to be non-selected. In FIG. 12, a table illustrating bias conditions during the read-out action, the programming action and the erasing action is shown. Furthermore, the flash memory comprises finite state machines or microcontrollers for controlling the read-out action, the programming action, and the erasing action, and these controllers control the actions of every component according to addresses, commands, and other information provided from the exterior, although this is not shown in the drawings.

A bias of the read-out voltage read1 is applied to the bit line BL 1 during the read-out action. The read-out voltage read1 is, for example, between 1V and 2V. A bias of the read-out voltage read2 is applied to the select gate line SG1. The read-out voltage read2 is higher than the threshold value of the select transistor SEL, and is, for example, between 1V and 3V. A bias of the read-out voltage read3 is applied to the control gate CG. The read-out voltage read3 is, for example, between 0V and 3V. All nodes except for the aforementioned ones are GND.

When the threshold value of the memory transistor MEM of the memory cell MC_1 is higher than the bias of the read-out voltage read3, the memory transistor MEM becomes a non-conducted condition, current does not flow from the bit line BL1 to the source line SL, and data "0" is recognized. When the threshold value of the memory transistor MEM of the memory cell MC_1 is lower than the bias of the read-out voltage read3, the memory transistor MEM becomes a conducted condition, current flows from the bit line BL1 to the source line SL, and data "1" is recognized.

The range of the threshold value Vt where data "0" and "1" are permissible becomes a higher or lower range than the read-out voltage read3. Compared to this, in situations where a conventional memory cell has one transistor without a select transistor, it is necessary for the threshold value Vt of the data "1" to be lower than the voltage of the control gate CG, and higher than 0V. If the threshold value Vt of the data "1" is lower than 0V, the erroneous read-out of other memory cells connected to the same bit line will undesirably occur.

Next, the programming action is described. A bias of programming voltage prog1 is applied to the bit line BL 1. The voltage prog1 is between 0V and less than 1V. A bias of programming voltage prog2 is applied to the bit line BL2. The voltage prog2 is higher than the voltage prog1, and shields and cuts the current from the bit line BL2 to the source line SL. Programming voltage prog4 is applied to the source line SL. The voltage prog4 is between 4V and 6V. Programming voltage prog3 is applied to the control gate CG of the memory cell MC_1. The voltage prog3 is between 5V and 10V. The select gate SG1 is supplied with programming voltage prog5 that is higher than the threshold value of the select gate SG1, and the select gate SG2 is supplied with a voltage between 0V and less than the threshold value of the select gate.

The electrical field in a lateral direction of the silicon surface between the control gate CG and the select gate line SG1 becomes really high, and hot electrons are injected into the charge storage layer directly under the control gate CG to store the electrons in the insulating film 14, thereby increasing the threshold value Vt of the memory transistor MEM of the memory cell MC_1. The programming method is referred to as "source-side hot-electron injection" because the hot electrons are generated in the channel region between the control gate CG and the select gate line SG. The source-side hot-electron injection has lower current consumption from bit line to source line. Therefore, it is possible to program a plurality of memory cells of 10 bytes or greater at one time, and it is possible to perform fast programming. The bias applying to the select gate line SG2 is equal to or less than the threshold value of the select gate, and therefore, the select transistor SEL connected to the select gate line SG2 is in an OFF condition, and the hot electron injection does not occur. As a result, other memory cells besides memory cell MC_1 do not suffer from the shift of the threshold value Vt in the memory transistor MEM.

Next, the erasing action is described. There are two types of methods to perform an erase. In an erasing method 1, the bit lines BL1 and BL2, and the select gate lines SG1 and SG2 are set to be floating, and they are approximately 0V. That is to say, the reason is that these nodes are being connected to one side of PN junctions of potential 0V. Erasing voltage era1 is applied to the control gate CG. The voltage era1 is between −3V and −5V. Erasing voltage era2 is applied to the source line SL. The voltage era2 is between 4V and 7V. The bias of the source line SL becomes larger by applying a negative bias to the control gate CG, thereby the injection of holes (positive holes) from the source line SL directly under the control gate CG to the charge storage layer 14 of the memory transistor MEM, or the release of electrons from the charge storage layer 14 to the source line SL occurs, and the threshold values Vt of the memory transistors MEM of all memory cells are decreased to be lower than the read-out voltage read3.

In the erasing method 2, the biases of the bit lines BL1 and BL2, and the select gate lines SG1 and SG2 are the same as those in the erasing method 1. Erasing voltage era3 is applied to the control gate CG. The voltage era3 is almost ~0V. Erasing voltage era4 is applied to the source line SL. The voltage era4 is between 7V and 10V. Like the erasing method 1, a high bias is applied to the source 5, and the threshold values Vt of the memory transistors MEM of the memory cells in the array are decreased to be less than the read-out voltage read3.

The erasing actions described above are performed to completely erase the memory cells in the selected memory array, and the memory transistors MEM in all the memory cells become the condition of data "1". There is no limitation to the minimum threshold value Vt of the memory cells of data "1", and therefore, the erasing yield becomes higher than that of the memory cell with a single transistor.

According to this example, it is possible to decrease memory cell size by using a transistor having a channel in the vertical direction. Furthermore, the memory cell of this example does not need a region for source line contact because the common source is directly connected to the channel region at the bottom of the channel region. Furthermore, the memory cell of this example does not need a region for bit line contact because the bit line is directly connected to the channel region at the top of the channel region. Furthermore, a circuit is formed under the memory cell array, thereby possibly reducing a region for the circuit. The technical effect may also contribute to a decrease in chip size.

In situations where a memory cell is constructed by only a single memory transistor, the problem of over-erasing lowers the yield. Some bits might have a negative threshold value Vt after the erasing action, and that makes read-out errors in other memory cells connected to the same bit line. Compared to this, the memory cell of this example includes not only the memory transistor but also the select transistor. Therefore, the problem of over-erasing does not occur. That is, during the read-out action, the select gate line of the non-selected memory cell shields and cuts the current of the cell during read-out of other memory cells connected to the same bit line.

In this example, the source-side hot-electron injection is used when performing a programming action, and it is possible to increase the efficiency of the electron injection. Therefore, it is possible to program a plurality of memory cells at one time, and fast programming is enabled.

Next, exemplary variations of the present disclosure are described. In the above example, the control gate is formed first, and then the select gate line is formed. However, this is only an example, and the positional relationship may be reversed. As shown in FIG. 13, a select gate layer is formed over the insulating layer 6, followed by patterning the select gate layer to form a plurality of select gate lines 2 extending in the Y direction. Subsequently, the insulating layer 7, the control gate 4, and the insulating layer 8 are sequentially formed. Thereafter, the steps shown in FIGS. 10A through 10I are performed.

Figure 14:
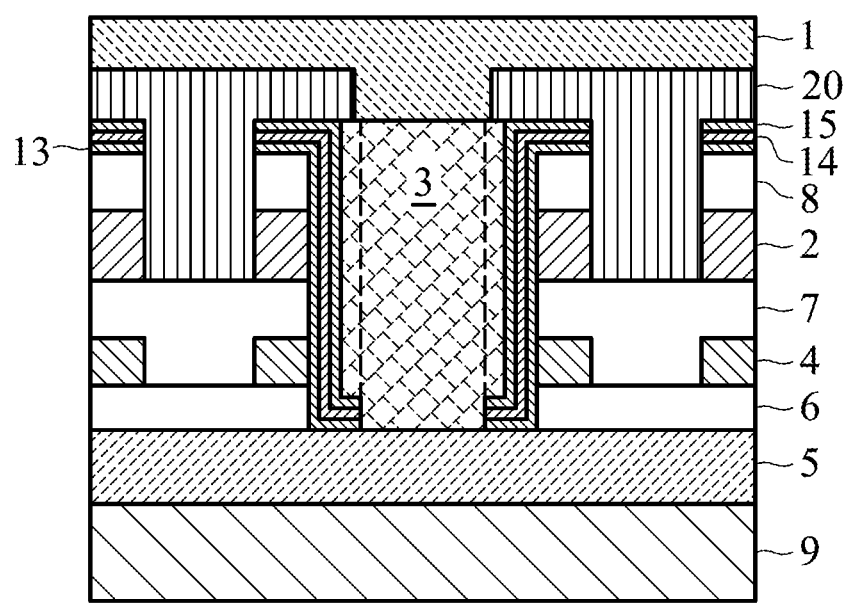
FIG. 14 is a cross-sectional view illustrating a configuration of memory cells of the flash memory in accordance with an exemplary variation of the present disclosure.

Furthermore, in the example described above, the control gate 4 is formed on the entire surface of the memory cell array to be common to all of the memory cells. However, this is only an example, and the control gate may be divided into a plurality of control gates. In this situation, as shown in FIG. 14, a layer for the control gates is formed, followed by patterning the layer to form a plurality of control gates 4. The control gate relating to the select memory cell is selected from the plurality of control gates, and voltage is applied to the selected control gate according to the bias condition during any of the described actions.

Figure 15A:
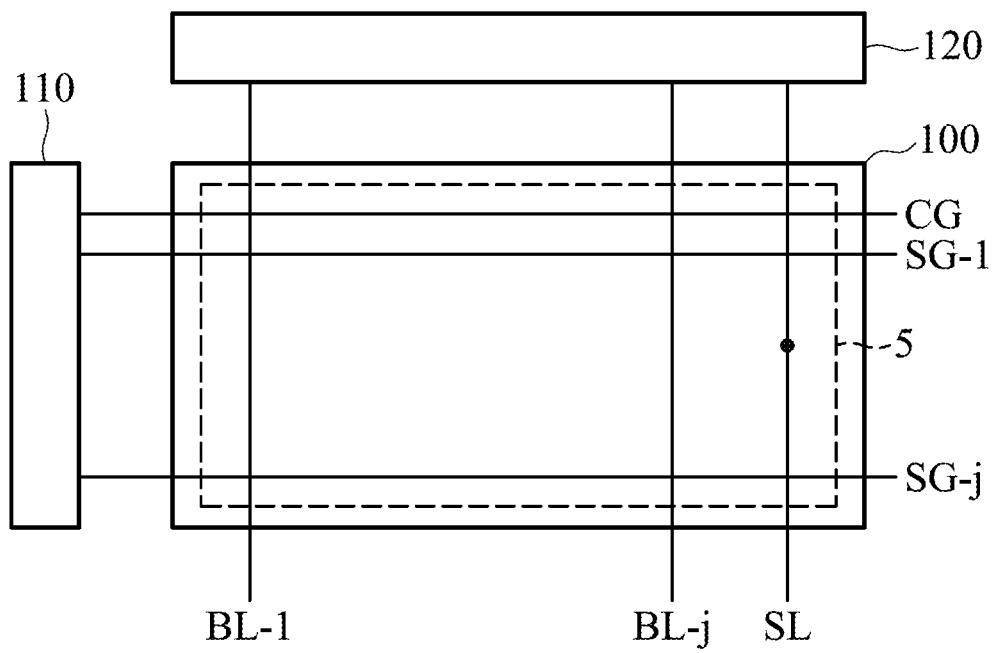
FIG. 15A is a diagram illustrating the relationships between the decoder and the memory cell array in accordance with an exemplary variation of the present disclosure.

Next, the relationship between the memory cell array and the decoder of this example is described. As shown in FIG. 15A, a p-well region 100 or a p-type silicon substrate 100 for constructing a memory cell is formed. A column selecting and driving circuit 110 selects the select gate line SG according to a column address, and voltage is applied to the selected select gate line SG according to the bias condition during any of the described actions. When a common control gate CG is formed for all the memory cells of the memory cell array, the column selecting and driving circuit 110 does not select the control gate 4, and voltage is applied to the control gate 4 according to the bias condition during any of the described actions. When the control gate 4 is divided into a plurality of control gates, the column selecting and driving circuit 110 selects the control gate 4 according to the column address, and voltage is applied to the selected control gate 4 according to the bias condition during any of the described actions.

Figure 15B:
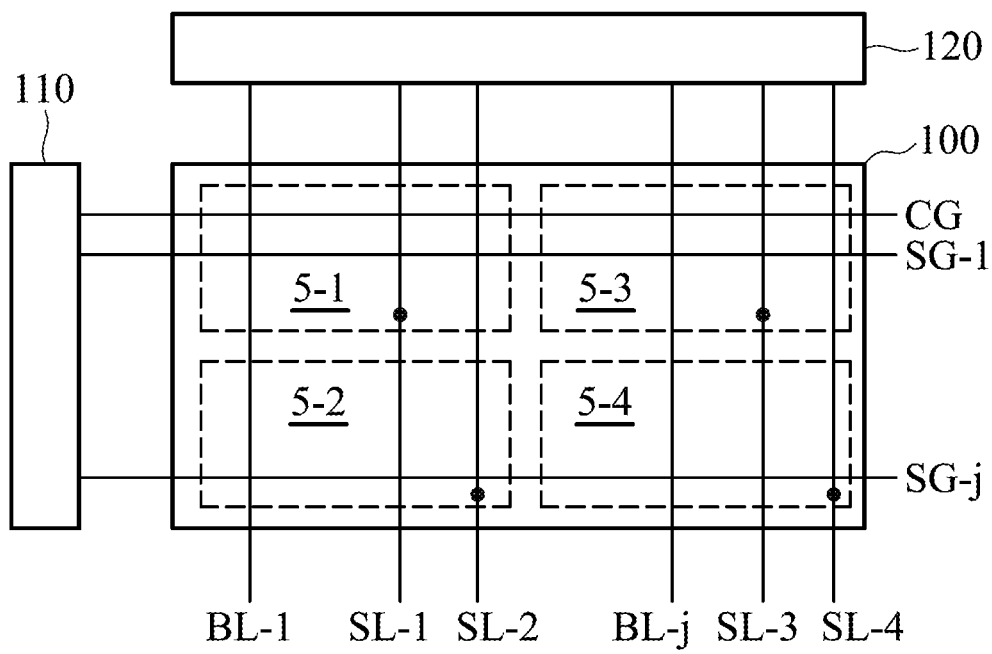
FIG. 15B is a diagram illustrating the relationships between the decoder and the memory cell array in accordance with an exemplary variation of the present disclosure.

Furthermore, a row selecting and driving circuit 120 selects the bit line BL according to a row address, and voltage is applied to the selected bit line BL according to the bias condition during the action. When the n$^+$ source 5 over the p-well region 100 or a p-type silicon substrate 100 is commonly formed for all the memory cells of the memory cell array, the row selecting and driving circuit 120 applies voltage to the source 5 according to the bias condition during the action. Furthermore, as shown in FIG. 15B, when the source 5 is divided into a plurality of sources (the source 5 is divided into four sources 5-1, 5-2, 5-3 and 5-4 in the example of the drawing), and the row selecting and driving circuit 120 selects a source 5 according to the row address and applies voltage to the selected source according to the bias condition during the action.

Figure 16A:
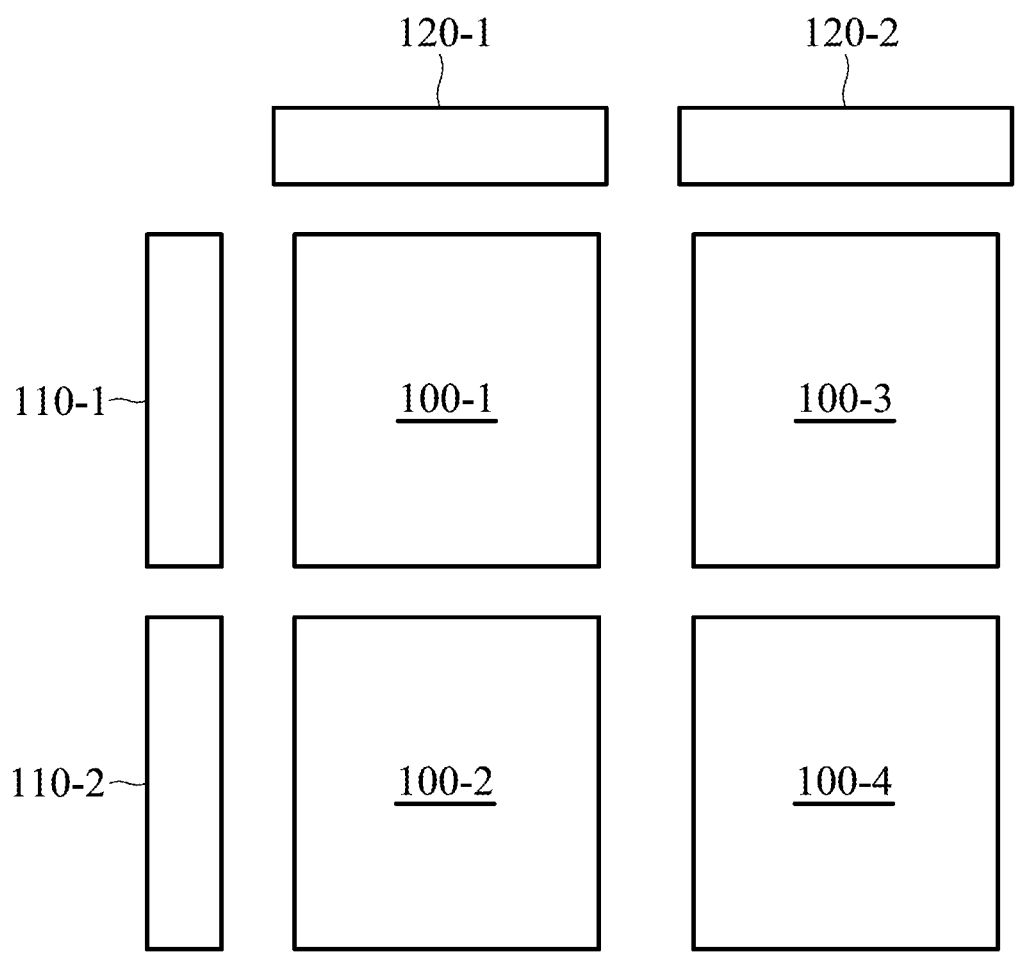
FIG. 16A is a cross-sectional view illustrating a configuration of memory cells of the flash memory in accordance with an exemplary variation of the present disclosure.

FIG. 16A illustrates another variation of the present disclosure. As shown in the same figure, for example, it is also possible to form a plurality of p-well regions 100-1, 100-2, 100-3 and 100-4 over the n-type silicon substrate to form three-dimensional memory cell arrays independently over every p-well region.

Figure 16B:
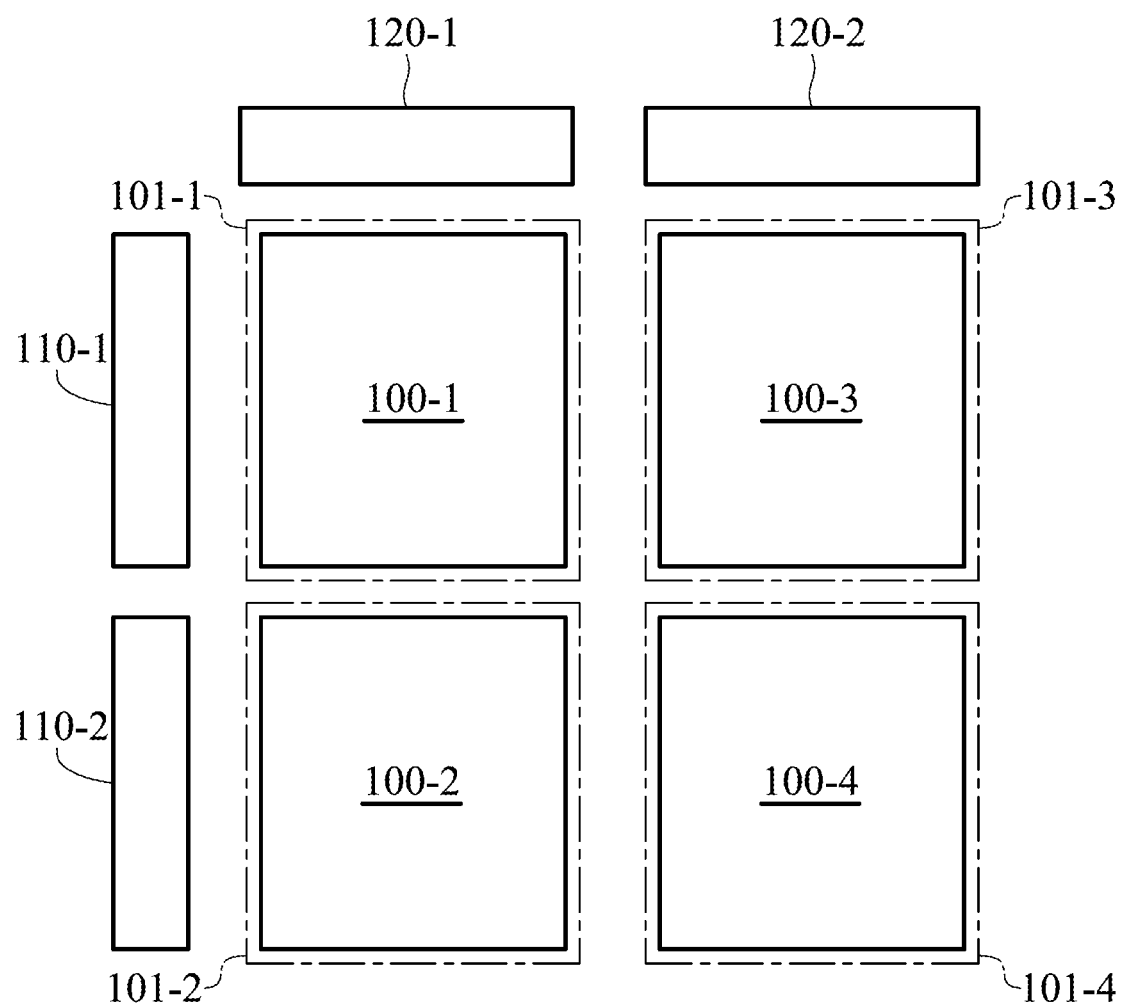
FIG. 16B is a cross-sectional view illustrating a configuration of memory cells of the flash memory in accordance with an exemplary variation of the present disclosure.

Furthermore, an alternate variation of the present disclosure is shown in FIG. 16B. As shown in the same figure, for example, it is also possible to form p-wells 100-1, 100-2, 100-3 and 100-4 surrounded by a plurality of n-wells 101-1, 101-2, 101-3 and 101-4 over the p-type silicon substrate to form three-dimensional memory cell arrays independently over every p-well region. In the examples of FIG. 16A or FIG. 16B, a common column selecting and driving circuit 110-1 is shared by the memory cell arrays of the p-wells 100-1 and 100-3, a common column selecting and driving circuit 110-2 is shared by the memory cell arrays of the p-wells 100-2 and 100-4, a common row selecting and driving circuit 120-1 is shared by the memory cell arrays of the p-wells 100-1 and 100-2, and a common row selecting and driving circuit 120-2 is shared by the memory cell arrays of the p-wells 100-3 and 100-4. However, the possible variations are not limited to the aforementioned, it is also possible to respectively form column selecting and driving circuits and row selecting and driving circuits per memory arrays of every p-well. In this situation, the bit lines, the select gate lines, the control gates, and the sources are independently in the respective memory cell arrays of every p-well.

Figure 17:
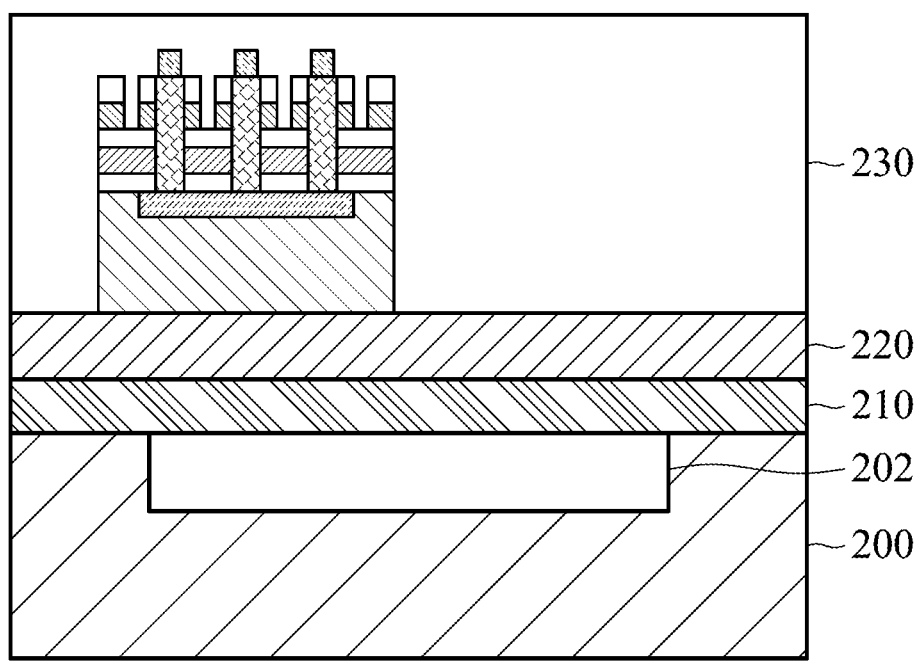
FIG. 17 is a cross-sectional view illustrating a configuration of memory cells of the flash memory in accordance with an exemplary variation of the present disclosure.

FIG. 17 illustrates another variation of the present disclosure. In this example, a three-dimensional memory cell array 230 is carried over the silicon substrate 20. A periphery circuit 202 such as a decoder, a booster circuit, or a sense circuit is formed in a silicon substrate 200. An insulating layer 210 is formed over the silicon substrate 200. A conductive layer 220 is formed over the insulating layer 210. A memory cell array 230 is formed over the conductive layer 220. The conductive layer 220 provides a common source for the memory cell 230. The conductive layer 220 is constructed by the n-type polycrystalline layer or a lamination of a metallic layer and the n-type polycrystalline silicon layer. The three-dimensional memory cell array 230 is formed over the conductive layer 220 by use of the fabrication steps described with reference to FIGS. 4 through 10. Thus, the periphery circuit is formed in the silicon substrate 200, and the memory cell array is laminated thereon, and it is possible to decrease the two-dimensional area of a memory chip.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A NOR-type flash memory, comprising:
a substrate;
a conductive region formed over the substrate;
a plurality of column portions extending from a surface of the substrate in a vertical direction, and comprising active regions; and
memory transistors and select transistors formed to surround side portions of each of the column portions; wherein
control gates are connected to gates of the memory transistors, and select gates are connected to gates of the select transistors;
one end of each of the respective column portions is electrically connected to a bit line, and an other end of each of the respective column portions is electrically connected to the conductive region; and
each of a plurality of memory cells comprises one memory transistor and one select transistor, and the memory transistor of each of the memory cells is in direct contact with the conductive region.

2. The NOR-type flash memory claimed in claim 1, further comprising a plurality of insulating layers formed between the control gates and the column portions, wherein an intermediate insulating layer of the plurality of insulating layers functions as a charge storage layer.

3. The NOR-type flash memory claimed in claim 1, wherein the column portions are formed of silicon, and regions between the silicon column portions and the control gates are surrounded by a plurality of insulating layers with an intermediate insulating layer formed of a silicon nitride film storing different quantities of electrical charge in a write-in operation and an erase operation.

4. The NOR-type flash memory claimed in claim 1, wherein the column portions are formed of silicon, and regions between the silicon column portions and the control gates and regions between the silicon column portions and the select gates are surrounded by a plurality of insulating layers with an intermediate insulating layer formed of a silicon nitride film storing different quantities of electrical charge in a write operation and an erasing operation.

5. The NOR-type flash memory claimed in claim 1, further comprising a memory cell array comprising the plurality of memory cells, wherein the memory cell array has a three-dimensional structure.

6. The NOR-type flash memory claimed in claim 5, wherein the control gates are shared by all the memory cells of the memory cell array.

7. The NOR-type flash memory claimed in claim 5, wherein the conductive region is shared by all the memory cells of the memory cell array.

8. The NOR-type flash memory claimed in claim 1, wherein the select gates are located in higher positions than those of the control gates.

9. The NOR-type flash memory claimed in claim 1, wherein
the substrate comprises a silicon substrate where a periphery circuit is formed; and
the conductive region is formed over the silicon substrate with an insulating region interposed therebetween.

10. The NOR-type flash memory claimed in claim 9, further comprising a control component applying a first programming voltage to the control gate of a select memory cell, and a second programming voltage to the conductive region to put the select transistor in a conductive condition via the select gate when performing a programming action.

11. The NOR-type flash memory claimed in claim 10, wherein the control component applies a first erasing voltage to the control gate of the select memory cell, and the control component applies a second erasing voltage to the conductive region to put the select gate and bit line in a floating condition when performing an erasing action.

12. The NOR-type flash memory claimed in claim 10, wherein the conductive region comprises a plurality of conductive regions, and the control component selects a conductive region according to address information.

13. The NOR-type flash memory claimed in claim 10, wherein the control gate comprises a plurality of control gates, and the control component selects a control gate according to address information.

* * * * *